United States Patent
Engelen et al.

(10) Patent No.: US 10,634,316 B2
(45) Date of Patent: Apr. 28, 2020

(54) METHODS AND APPARATUS FOR CONTROLLING LIGHTING

(71) Applicant: SIGNIFY HOLDING B.V., Eindhoven (NL)

(72) Inventors: Dirk Valentinus René Engelen, Heusden-Zolder (BE); Dzmitry Viktorovich Aliakseyeu, Eindhoven (NL); Bartel Marinus Van De Sluis, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 793 days.

(21) Appl. No.: 14/549,994

(22) Filed: Nov. 21, 2014

(65) Prior Publication Data

US 2015/0077986 A1 Mar. 19, 2015

Related U.S. Application Data

(62) Division of application No. 14/365,150, filed as application No. PCT/IB2012/057304 on Dec. 14, 2012, now Pat. No. 10,465,882.

(Continued)

(51) Int. Cl.
| | |
|---|---|
| G05B 19/10 | (2006.01) |
| F21V 14/02 | (2006.01) |
| G06T 15/50 | (2011.01) |
| H05B 37/02 | (2006.01) |
| G06F 3/0488 | (2013.01) |
| G06F 3/0484 | (2013.01) |

(Continued)

(52) U.S. Cl.
CPC ............ *F21V 14/02* (2013.01); *F21V 23/003* (2013.01); *G05B 15/02* (2013.01); *G06F 3/04847* (2013.01); *G06F 3/04883* (2013.01); *G06T 15/506* (2013.01); *H05B 33/0845* (2013.01); *H05B 37/029* (2013.01); *G06T 2200/24* (2013.01); *G06T 2210/04* (2013.01); *H05B 33/0857* (2013.01)

(58) Field of Classification Search
CPC .. H05B 37/029; H05B 37/0245; H05B 37/02; H05B 37/0254; G05B 19/0426; G05B 2219/23258; G05B 2219/25067; G05B 19/409; G06F 3/0481; H04L 67/12
See application file for complete search history.

(56) References Cited

U.S. PATENT DOCUMENTS 5,307,295 A * 4/1994 Taylor ................. G06F 17/5009
315/292
6,448,987 B1 * 9/2002 Easty .................... G06F 3/0482
715/834

(Continued)

FOREIGN PATENT DOCUMENTS

| | | |
|---|---|---|
| CN | 102090151 A | 6/2011 |
| JP | 2010078854 A | 4/2010 |

(Continued)

*Primary Examiner* — Darrin D Dunn
(74) *Attorney, Agent, or Firm* — Meenakshy Chakravorty

(57) ABSTRACT

Inventive methods and apparatus for interactive control of a lighting environment. In some embodiments an interactive system for controlling redirectable lighting in a lighting environment may be provided. In some embodiments systems and methods may be provided that enable the display of adjustable lighting parameters in a virtual environment.

14 Claims, 5 Drawing Sheets

Related U.S. Application Data

(60) Provisional application No. 61/570,319, filed on Dec. 14, 2011.

(51) Int. Cl.
  *G05B 15/02* (2006.01)
  *F21V 23/00* (2015.01)
  *H05B 33/08* (2020.01)

(56) References Cited

U.S. PATENT DOCUMENTS

| | | | |
|---|---|---|---|
| 6,587,131 B1 | 7/2003 | Nakai et al. | |
| 6,611,297 B1 | 8/2003 | Akashi et al. | |
| 7,242,152 B2* | 7/2007 | Dowling | H05B 37/029 315/169.1 |
| 7,251,637 B1 | 7/2007 | Caid et al. | |
| 7,400,458 B2* | 7/2008 | Farr | G02B 27/147 250/550 |
| 7,495,671 B2* | 2/2009 | Chemel | H05B 37/029 345/594 |
| 7,710,271 B2* | 5/2010 | Frumau | H05B 37/0272 250/227.21 |
| 7,765,486 B2* | 7/2010 | Jaeger | G06F 3/0481 715/764 |
| 8,264,168 B2* | 9/2012 | Feri | H05B 37/0272 315/294 |
| 8,937,444 B2* | 1/2015 | Ogg | H05B 37/0245 315/292 |
| 9,001,203 B2 | 4/2015 | Shimada et al. | |
| 9,696,867 B2 | 7/2017 | Holz | |
| 2001/0030668 A1 | 10/2001 | Erten et al. | |
| 2002/0140745 A1 | 10/2002 | Ellenby et al. | |
| 2002/0181070 A1* | 12/2002 | Hewlett | G02B 26/0833 359/291 |
| 2003/0184602 A1 | 10/2003 | Kuroki et al. | |
| 2004/0160199 A1 | 8/2004 | Morgan et al. | |
| 2005/0010318 A1* | 1/2005 | Lev-Ami | G05B 19/41875 700/109 |
| 2005/0123171 A1 | 6/2005 | Kobayashi et al. | |
| 2005/0231134 A1 | 10/2005 | Sid | |
| 2005/0272506 A1 | 12/2005 | Sumi | |
| 2006/0085170 A1* | 4/2006 | Glaser | G06F 17/5009 703/1 |
| 2006/0168183 A1* | 7/2006 | Fuller, III | G05B 19/0426 709/223 |
| 2006/0227151 A1 | 10/2006 | Bannai | |
| 2007/0070069 A1 | 3/2007 | Samarasekera et al. | |
| 2008/0062682 A1* | 3/2008 | Hoelen | F21V 7/0091 362/231 |
| 2008/0070684 A1 | 3/2008 | Haigh-Hutchinson | |
| 2008/0140231 A1 | 6/2008 | Blackwell et al. | |
| 2008/0183337 A1 | 7/2008 | Szabados | |
| 2008/0259590 A1* | 10/2008 | De Goederen-Oei | G06F 3/04847 362/85 |
| 2008/0267450 A1 | 10/2008 | Sugimoto et al. | |
| 2008/0316730 A1 | 12/2008 | Diederiks et al. | |
| 2009/0009984 A1* | 1/2009 | Mangiardi | H05B 37/029 362/85 |
| 2009/0016046 A1* | 1/2009 | Witsenburg | A47F 11/10 362/145 |
| 2009/0046454 A1* | 2/2009 | Bertram | G02B 27/0977 362/231 |
| 2009/0284187 A1 | 11/2009 | Diederiks et al. | |
| 2010/0053198 A1* | 3/2010 | Vinkenvleugel | G06F 3/04847 345/594 |
| 2010/0090619 A1 | 4/2010 | Adamson et al. | |
| 2010/0149109 A1 | 6/2010 | Elias | |
| 2010/0208033 A1 | 8/2010 | Edge et al. | |
| 2010/0277107 A1 | 11/2010 | Baaijens et al. | |
| 2010/0301776 A1 | 12/2010 | Feri et al. | |
| 2010/0308755 A1* | 12/2010 | Van Liempd | H05B 33/0863 315/363 |
| 2010/0312366 A1* | 12/2010 | Madonna | H05B 37/0245 700/90 |
| 2010/0315390 A1* | 12/2010 | Bergman | A47F 11/10 345/204 |
| 2011/0035404 A1 | 2/2011 | Morgan et al. | |
| 2011/0041091 A1* | 2/2011 | Sato | G06F 3/04817 715/772 |
| 2011/0074672 A1* | 3/2011 | Diederiks | H05B 37/0218 345/156 |
| 2011/0112691 A1* | 5/2011 | Engelen | H05B 37/029 700/275 |
| 2011/0141010 A1 | 6/2011 | Sakata et al. | |
| 2011/0273114 A1 | 11/2011 | Ogg et al. | |
| 2011/0280449 A1 | 11/2011 | Campbell, Jr. et al. | |
| 2012/0014558 A1 | 1/2012 | Stafford et al. | |
| 2012/0095745 A1 | 4/2012 | Le Guevel-Scholtens et al. | |
| 2012/0161643 A1* | 6/2012 | Henig | H05B 37/0254 315/151 |
| 2012/0242676 A1* | 9/2012 | George | G09G 5/222 345/589 |
| 2013/0212509 A1* | 8/2013 | Van Seggelen | G01C 21/3484 715/771 |
| 2013/0221872 A1 | 8/2013 | Gan et al. | |
| 2014/0354160 A1 | 12/2014 | Aggarwal et al. | |
| 2015/0154808 A1 | 6/2015 | Engelen et al. | |
| 2015/0286724 A1 | 10/2015 | Knaapen et al. | |
| 2016/0120009 A1 | 4/2016 | Aliakseyeu et al. | |

FOREIGN PATENT DOCUMENTS

| | | | |
|---|---|---|---|
| WO | 2010004448 A1 | 1/2010 | |
| WO | WO-2010140107 A2 * | 12/2010 | H05B 33/0863 |
| WO | 2011092609 A1 | 8/2011 | |
| WO | 2012049656 A1 | 4/2012 | |
| WO | 2012131544 A1 | 10/2012 | |

* cited by examiner

METHODS AND APPARATUS FOR CONTROLLING LIGHTING

CROSS REFERENCE TO PRIOR APPLICATIONS

This application is a divisional of co-pending U.S. patent application Ser. No. 14/365,150, filed Jun. 13, 2014, which is a U.S. National Stage Application under 35 U.S.C. § 371 of International Application No. PCT/IB2012/057304, filed on Dec. 14, 2012, which claims the benefit of U.S. Provisional Patent Application No. 61/570,319, filed on Dec. 14, 2011. These prior applications hereby are incorporated herein by reference.

TECHNICAL FIELD

The present invention is directed generally to lighting control. More particularly, various inventive methods and apparatus disclosed herein relate to an interactive system for control of a lighting environment.

BACKGROUND

In certain lighting system implementations it may be desirable to adjust the lighting parameters of one or more light sources to achieve a desired lighting effect at one or more locations in a lighting environment. For example, it may be desirable to adjust the pan and/or tilt of a light source such as a light source of a "moving head" type spot lighting fixture. Also, for example, it may be desirable to adjust the direction of a LED-based light source (with or without adjusting the pan and/or tilt of such LED-based light source). For example, a LED-based light source may include a plurality of LEDs that generate collimated light beams in different directions and/or from different locations. Selective LEDs of the LED-based light source may be illuminated to direct one or more light beams at one or more locations in a lighting environment. Also, for example, a LED-based light source may additionally or alternatively include one or more redirectable optical elements each provided over one or more LEDs that may be selectively actuated to direct light output from the LED(s) to a desired location.

In certain control situations a user may prefer to have the option to control a desired lighting effect (e.g., the location of a lighting effect, the incoming direction of light creating the lighting effect, the intensity of the lighting effect) instead of or in addition to controlling the lighting source directly (e.g., directly adjusting pan/tilt and/or LED light source output). The Applicants have recognized that lighting effect based control of a light source should be represented in a manner that enables a user to understand the applied lighting effect and that also optionally provides an indication of what other lighting effects might be obtainable.

Thus, there is a need in the art to provide apparatus and methods that enable the user to control and specify one or more desired lighting effects in a lighting system and that, optionally, may provide an indication of capabilities and restrictions of the lighting system.

SUMMARY

The present disclosure is directed to inventive methods and apparatus for interactive control of a lighting environment. For example, in some embodiments an interactive system for controlling redirectable lighting in a lighting environment may be provided. The system may enable a user to control and specify one or more desired lighting effects and may optionally provide an indication of capabilities and restrictions of the lighting system. Also, for example, in some embodiments a method of controlling a lighting system for lighting an environment may be provided and include manipulation of a lighting representation in an interactive display and corresponding manipulation of light output of a light source. Also, for example, in some embodiments, systems and methods may be provided that enable the display of adjustable lighting parameters in a virtual environment.

Generally, in one aspect, an interactive system for controlling redirectable lighting in a lighting environment is provided that includes an interactive display having a representation of the lighting environment. The representation includes at least one repositionable lighting representation. The lighting representation is associated with at least one redirectable light source and includes a light source representation and a lighting effect representation. The light source representation includes at least one of a source variable size and a source variable shading corresponding to a lighting parameter of the redirectable light source. The lighting effect representation includes at least one of an effect variable size and an effect variable shading corresponding to a lighting effect of the redirectable light source at a current position of the repositionable lighting effect representation.

In some embodiments, the source variable size corresponds to a beam width of the light source. In some versions of those embodiments the light source representation includes both the source variable size and the source variable shading. In some versions of those embodiments the source variable shading corresponds to a dimming level of the light source.

In some embodiments, the effect variable size corresponds to a size of the lighting effect at the current position. In some versions of those embodiments the lighting effect representation includes both the effect variable size and the effect variable shading. In some versions of those embodiments the effect variable shading corresponds to an illumination level of the current position. The light source representation can be encapsulated within the light effect representation.

In some embodiments, a plurality of the redirectable light source are provided and the lighting representation is selectively associable with at least one of the plurality of the redirectable light source. Also, the lighting parameter can be adjustable via manipulation of the lighting representation on the display.

Generally, in another aspect, an interactive system for controlling redirectable lighting in a lighting environment is provided that includes an interactive display having a representation of the lighting environment. The representation includes a plurality of light sources, at least one repositionable lighting representation, and a repositionable directional fiducial marking. The repositionable directional fiducial marking is associated with the repositionable lighting representation and indicates a direction of light for the lighting representation.

In some embodiments, the fiducial marking extends from adjacent one of the plurality of light sources toward the repositionable lighting representation and is individually repositionable to other of the light sources. In some versions of those embodiments the fiducial marking is a line.

In some embodiments, the repositionable lighting representation corresponds to a current position of the repositionable lighting representation and to which of the light sources the fiducial marking extends toward.

In some embodiments, the repositionable lighting representation includes an outer shape and an inner shape encapsulated within the outer shape.

In some embodiments, the repositionable lighting representation includes a light source representation and a lighting effect representation. In some versions of those embodiments the light source representation includes at least one of a variable size and a variable shading corresponding to a lighting parameter of one of the light sources. In some versions of those embodiments the lighting effect representation includes at least one of a variable size and a variable shading corresponding to a lighting effect at a current position of the repositionable lighting representation. In some versions of those embodiments the variable size corresponds to a beam width. In some versions of those embodiments the light source representation includes both the variable size and the variable shading. In some versions of those embodiments the variable size corresponds to a size of the lighting effect. In some versions of those embodiments the lighting effect representation includes both the variable size and the variable shading. In some versions of those embodiments the variable shading corresponds to an illumination level of the current position.

Generally, in another aspect, a method of controlling a lighting system for lighting an environment is provided and includes: moving a lighting representation to a virtual location on an interactive display, the virtual location representative of a real location in the lighting environment; directing a light output of a lighting source to the real location; adjusting at least one of a size and a shading of the lighting representation on the interactive display; and adjusting at least one of a beam width, a color, and an intensity of the light output in response to the adjusting of at least one of the size and the shading of the lighting representation.

In some embodiments, the method further includes the step of adjusting a fiducial marking associated with the repositionable lighting representation on the virtual screen, wherein adjusting the fiducial marking adjusts directionality of artificial light incident at the real location. In some versions of those embodiments adjusting the fiducial marking adjusts directionality of the light output. In some versions of those embodiments adjusting the fiducial marking directs a second light output of a second light source to the real location.

In some embodiments, the method further includes the step of moving a distal end of a fiducial marking extending from adjacent the lighting effect representation from adjacent a first virtual light source location to adjacent a second virtual light source location—the first virtual light source location corresponding with the lighting source and the second virtual light source location corresponding with a separate second lighting source—and directing a light output of the second lighting source to the real location.

In some embodiments, the lighting effect representation includes an outer shape and an inner shape encapsulated within the outer shape.

In some embodiments, the repositionable lighting representation includes a light source representation and a lighting effect representation. In some versions of those embodiments at least one of the size and the shading of the light source representation is adjusted. In some versions of those embodiments at least one of the size and the shading of the lighting effect representation is adjusted. In some versions of those embodiments adjusting the shading of the lighting effect representation automatically adjusts the shading of the light source representation. The beam width can optionally be adjusted in response to adjusting the size of the lighting effect representation. The beam width can also be adjusted in response to adjusting the size. In some versions of those embodiments the intensity is adjusted in response to adjusting the shading.

Generally, in another aspect, a method of displaying lighting parameters in a virtual environment is provided and includes the steps of: identifying a location of a lighting effect within a virtual environment indicative of a real word environment; determining at least one of a first size and a first shading of a first shape to correspond to a lighting parameter of a light source; determining at least one of a second size and a second shading of a second shape to correspond to the lighting effect of the light source at the location; and overlaying the first shape and the second shape over the location in the virtual environment.

In some embodiments, the first shape is encapsulated within the second shape. In some versions of those embodiments the method further includes the step of positioning a fiducial marking between the light source and the first shape and the second shape.

In some embodiments, the first size, the first shading, the second size, and the second shading are all determined.

In some embodiments, the step of identifying the location includes identifying a location of the light source in the real world environment and identifying a direction of a light output of the light source. In some versions of those embodiments the step of identifying the location further includes identifying the distance between the light source and an actual location in the real world environment. The step of identifying the location optionally includes registering real world objects with virtual objects in the virtual environment.

In some embodiments, the method further includes the step of adjusting at least one of the second size and the second shading of the second shape to correspond to adjustment of the lighting effect.

In some embodiments, the virtual environment is an augmented reality environment.

Generally, in another aspect, a method of displaying lighting parameters in a virtual environment is provided and includes the steps of: identifying a direction of a light output of a light source in a real world environment; identifying a distance between the light source and an actual illumination location in the real world environment; positioning a lighting effect representation within a virtual environment indicative of the real word environment, wherein the positioning is based on the direction and the distance; and configuring the lighting effect to be indicative of lighting conditions at the actual illumination location, wherein the configuring is based on the distance.

In some embodiments, the configuring includes determining a size of the lighting effect representation.

In some embodiments, the configuring includes determining a shading of the lighting effect representation.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers. Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein. Additionally, a light source may include as an integral component one or more filters (e.g., color filters), lenses, or other optical components. Also, it should be understood that light sources may be configured for a variety of applications, including, but not limited to, indication, display, and/or illumination. An "illumination source" is a light source that is particularly configured to generate radiation having a sufficient intensity to effectively illuminate an interior or exterior space. In this context, "sufficient intensity" refers to sufficient radiant power in the visible spectrum generated in the space or environment (the unit "lumens" often is employed to represent the total light output from a light source in all directions, in terms of radiant power or "luminous flux") to provide ambient illumination (i.e., light that may be perceived indirectly and that may be, for example, reflected off of one or more of a variety of intervening surfaces before being perceived in whole or in part).

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a FWHM having essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

The term "addressable" is used herein to refer to a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one network implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present disclosure, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

The term "user interface" as used herein refers to an interface between a human user or operator and one or more devices that enables communication between the user and the device(s). Examples of user interfaces that may be employed in various implementations of the present disclosure include, but are not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

In certain lighting system implementations it may be desirable to adjust the lighting parameters of one or more light sources to achieve a desired lighting effect at one or more locations in a lighting environment. For example, it may be desirable to adjust the pan and/or tilt of a light source such as a light source of a moving head type spot lighting fixture. Also, for example, it may be desirable to adjust the direction of light output of a LED-based light source (with or without adjusting the pan and/or tilt of such LED-based light source). In certain control situations a user may prefer to have the option to control a desired lighting effect instead of or in addition to controlling the lighting source directly. Applicants have recognized and appreciated that lighting effect based control of a light source should be represented in a manner that enables a user to understand the applied lighting effect and that also optionally provides an indication of what other lighting effects might be obtainable.

Thus, there is a need in the art to provide apparatus and methods that enable the user to control and specify one or more desired lighting effects in a lighting system and that optionally provides an indication of capabilities and restrictions of the lighting system.

More generally, Applicants have recognized and appreciated that it would be beneficial to provide various inventive methods and apparatus related to interactive system for control of a lighting environment.

In view of the foregoing, various embodiments and implementations of the present invention are directed to lighting control.

In the following detailed description, for purposes of explanation and not limitation, representative embodiments disclosing specific details are set forth in order to provide a thorough understanding of the claimed invention. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the representative embodiments. Such methods and apparatus are clearly within the scope of the claimed invention. For example, aspects of the methods and apparatus disclosed herein are described in conjunction with control of a lighting system in a retail environment. However, one or more aspects of the methods and apparatus described herein may be implemented in other settings such as, for example, offices, theatre, and home environments. Implementation of the one or more aspects described herein in alternatively configured environments is contemplated without deviating from the scope or spirit of the claimed invention.

Figure 1:
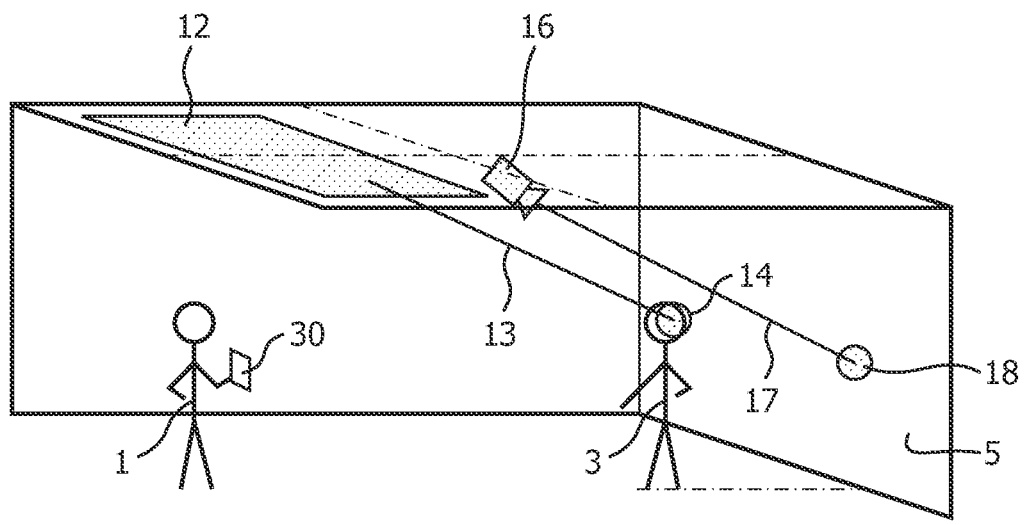
FIG. 1 illustrates a user in a retail environment redirecting light sources of a lighting system onto a mannequin utilizing an augmented reality display device.

Referring to FIG. 1, a user 1 and a mannequin 3 are illustrated a retail environment. The user is utilizing an augmented reality display device 30 to configure light output from LED lighting fixture 12 and redirectable spot lighting fixture 16. One or more LED-based light sources of the LED lighting fixture 12 are configured so as to provide a light output generally along line 13 to provide lighting of the face of the mannequin 3 as generally indicated at circle 14. For example, one or more selected directional LEDs of the LED lighting fixture 12 may be illuminated to a desired level to provide the illustrated directional light output. The redirectable spot lighting fixture 16 is also configured so as to provide a light output generally along line 17 to provide lighting on a wall 5 of the retail environment as generally indicated at circle 18. For example, the pan, the tilt, beam width, and/or intensity of the redirectable spot lighting fixture 16 may be adjusted (e.g., via a motor) so as to provide the lighting as generally indicated at circle 18. The redirectable spot lighting fixture 16 may be providing general lighting of the wall 5 or may optionally be directed at a specific display on the wall 5 for illumination of such display.

In some embodiments, the augmented reality display device 30 may be a portable electronic device which has at one side a display 31 and at a side opposite the display a camera. In some embodiments the display may provide an image of the environment captured by the camera of the display device 30 and may overlay the image with one or more overlay items such as those described herein. For example, the image captured by the camera of the display device 30 may be overlaid with one or more representations of a lighting effect, a light output direction, and/or a lighting source. In alternative embodiments the display device 30 may overlay an image that is captured by a remote camera and/or an image that does not necessarily correspond to the location at which the display device 30 is currently located (e.g., the user may modify lighting parameters from a remote location). In some embodiments the display may provide a 3D rendering, schematic representation, or other representation of the environment and may include one or more representations of a lighting effect, a light output direction, and/or a lighting source. Display device 30 is provided herein as an example of a display and user interface that may be utilized to implement one or more of the systems and/or methods described herein. However, one of ordinary skill in the art, having had the benefit of the present disclosure, will recognize and appreciate that in alternative embodiments additional and/or alternative displays and user interfaces may be utilized that provide a representation of an actual lighting environment, enable manipulation of lighting parameters of a lighting system within the lighting environment, and optionally provide an indication of capabilities and restrictions of the lighting system.

As described herein, the user 1 may utilize the display device 30 to provide a desired lighting effect for the selected location (e.g., via direct input to a user interface of the display device 30). Based on the provided input, the display device may in some embodiments immediately generate control signals and provide them to the lighting fixtures 12 and/or 16 (e.g., via a network utilizing one or more communication protocols such as DMX, Ethernet, Bluetooth, ZigBee, and/or Z-Wave) so that the user 1 is able to immediately see the real world effect of the selected control parameters. In another embodiment, the lighting system is not immediately controlled, but may be later adjusted based on selected control parameters (either directly via display device 30 or through a separate controller).

Figure 2:
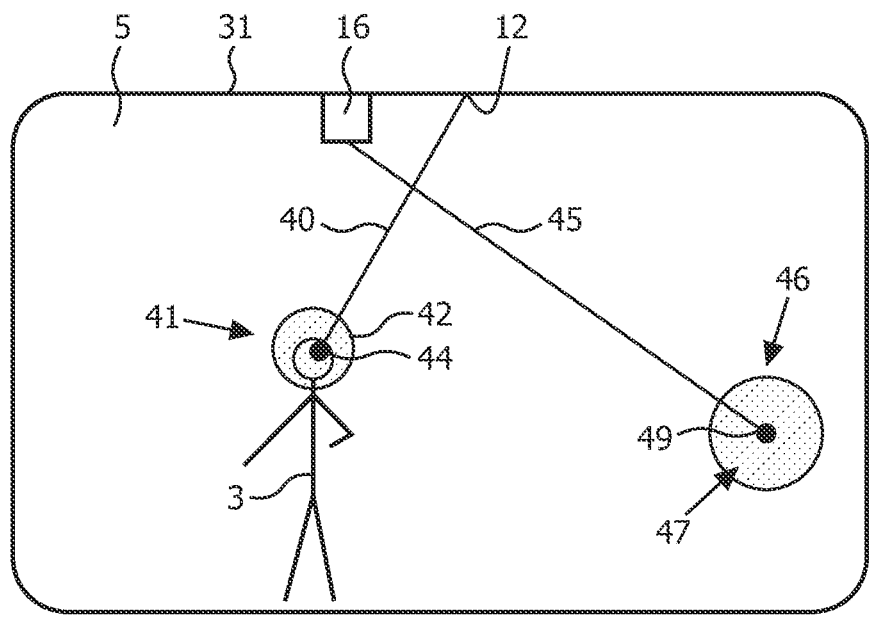
FIG. 2 illustrates the display of the augmented reality display device of FIG. 1.

Referring to FIG. 2, the display 31 of the augmented reality display device 30 of FIG. 1 is illustrated. Provided on the display 31 is a representation of the mannequin 3, a representation of the wall 5, a representation of the redirectable spot lighting fixture 16, and a representation of the LED lighting fixture 12. Illustrated extending from the LED lighting fixture 12 is a stick 40. The stick 40 is interposed between the LED lighting fixture 12 and a lighting representation 41 over the head of the mannequin 3. The stick 40 provides an indication of the direction of the light output provided by the LED lighting fixture 12 and the lighting representation 41 attached to the stick 40 provides an indication of the area illuminated by the light output provided by the LED lighting fixture 12.

The illustrated lighting representation 41 has an outer circle 42 and an inner circle 44. The inner circle 44 may be indicative of one or more properties of the light source of the LED lighting fixture 12. For example, the size of the inner circle 44 may be indicative of the beam width of the light output of the LEDs of the LED lighting fixture that are active and directed at the mannequin. Also, for example, the shading of the inner circle 44 may be indicative of the dimming value of such LEDs. For example, greylevels between black and white may be mapped to the dimming level of the lamp. Accordingly, by viewing the shading of the inner circle 44 a user will be able to ascertain if the dimming level may be increased and/or decreased to alter the illumination at the effect location. The outer circle 42 is indicative of one or more properties of the lighting effect provided by the output from LED lighting fixture 12 at the lighting effect location (e.g., the face of the mannequin 3 in FIG. 2). For example, the size of the outer circle 42 may be indicative of the size of the lighting effect provided by the output from LED lighting fixture 12 at the lighting effect location. Also, for example, the shading of the outer circle 42 may be indicative of the illumination provided to the illuminated object by the output from LED lighting fixture 12 at the lighting effect location. The indication of illumination provided to the illuminated object by the output from the LED lighting fixture 12 may be determined based on, for example, properties of the LEDs of the LED lighting fixture 12 that are illuminating the lighting effect location, the dimming level of the LEDs, and/or the distance between the LEDs and the illuminated object.

Illustrated extending from the spot lighting fixture 16 is a stick 45. The stick 45 is interposed between the spot lighting fixture 16 and a lighting representation 46 on the wall 5. The stick 45 provides an indication of the direction of the light output provided by the spot lighting fixture 16 and the lighting representation 46 attached to the stick 45 provides an indication of the area illuminated by the light output provided by the spot lighting fixture 16.

The lighting representation 46 has an outer circle 47 and an inner circle 49. The inner circle 49 is indicative of one or more properties of the light source of the spot lighting fixture 16. For example, the size of the inner circle 49 may be indicative of the beam width and the shading of the inner circle 49 may be indicative of the dimming value. The outer circle 47 is indicative of one or more properties of the lighting effect provided by the output from spot lighting fixture 16 at the lighting effect location. For example, the size of the outer circle 47 may be indicative of the size of the lighting effect and the shading of the outer circle 47 may be indicative of the illumination provided to the illuminated object at the lighting effect location.

Although outer circles 42, 47 and concentric inner circles 44, 49 are illustrated in FIG. 2, in alternative embodiments the outer circles 42, 47 and/or inner circles 44, 49 may optionally be another shape. For example, in some embodiments the outer circle 42 and/or inner circle 44 may be triangular, rectangular, elliptical, or polygonal. Also, in some embodiments the outer circles 42, 47 and inner circles 44, 49 may be non-concentric with one another. Also, in some embodiments the inner circles 44, 49 may not be provided encapsulated within the outer circles 42, 47. For example, all or portions of the inner circle 44 may be provided exterior to the outer circle 42. Also, for example, in some embodiments the outer circles 42, 47 and/or inner circles 44, 49 may be shaped to provide an indication of the beam shape of the light source and/or lighting effect. For example, a first beam shape may be represented by a first shape and a second beam shape may be represented by a second shape. Optionally, the beam shapes and the shape representing the beam shape may correspond.

Figure 3:
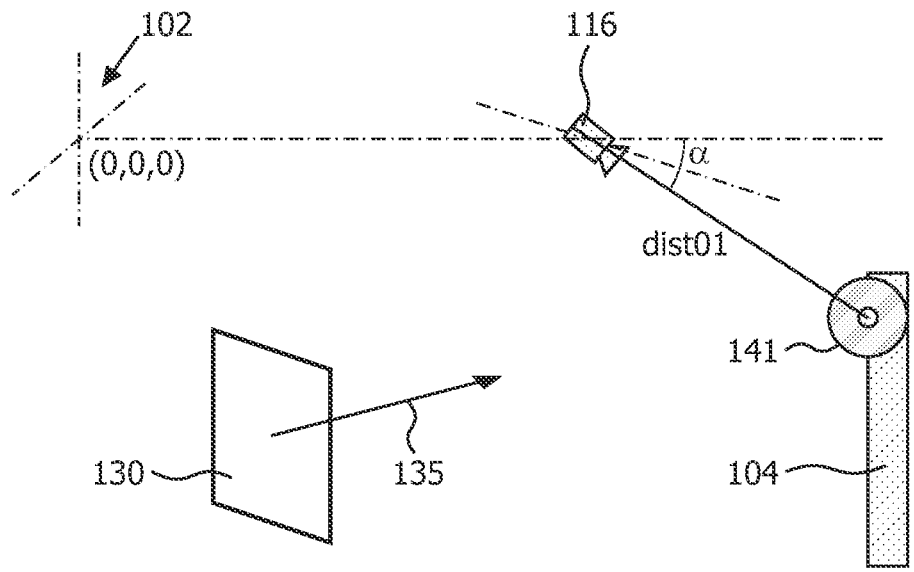
FIG. 3 illustrates the positioning of an augmented reality display device, a redirectable spot, and an object within a coordinate system of the real environment.

FIG. 3 illustrates the positioning of an augmented reality display device 130, a redirectable spot lighting fixture 116, and an object 104 within a coordinate system of a real environment having a reference point at 102. A lighting representation 141 is also illustrated. The coordinate system is illustrated as an example of one of many coordinate systems that may be utilized. In some embodiments the coordinate system may include GPS coordinates and/or local coordinates. The redirectable spot lighting fixture 116 is located at a location spaced along a single axis relative to the reference point at 102. The location of the redirectable spot lighting fixture 116 within the coordinate system may be provided via configuration by a user (e.g. entering of the coordinates by a user) or utilizing one or more location methods. The direction of the light beam generated by the spot lighting fixture 116 may also be determined utilizing, for example, pan and/or tilt values communicated to the fixture 116 by a controller directing the fixture 116 and/or via feedback from a motor of the fixture 116. For example, the controller may control the fixture 116 utilizing a DMX control protocol and pan and tilt values may be derived from DMX control signals sent to the fixture 116. The distance between the fixture 116 and the lighting representation 141 is also determinable. For example, the distance may be determined via a distance sensor (e.g., a laser) provided on the fixture 116 and aimed in the same direction as the center of the light beam generated by the fixture 116. Also, for example, the distance may be calculated if a virtual model of the real environment is available and includes the location of the lighting fixture 116 and the object 104.

The location and/or viewing angle(s) (generally indicated by arrow 135) of the display device 130 are also determinable. For example, the location of the display device 130 within the coordinate system may be provided via configuration by a user (e.g. entering of the coordinates by a user) or utilizing one or more location methods. Also, for example, the viewing angle(s) of the display device may be determined via an orientation sensor such as, for example, a digital compass (e.g., a magnetometer, gyrocompass, and/or hall effect sensors) a gyroscope, an accelerometer, and/or a three-axis electronic compass. The sensor(s) of the display device 130 may include a GPS sensor or other sensor which is capable of determining the location of the display device 130 within the environment; an electronic compass or other sensor that is capable of determining the direction in which the camera of the display device 130 is directed; and a zoom controller of the camera or other sensor that may detect the angle of view of the camera.

Figure 4:
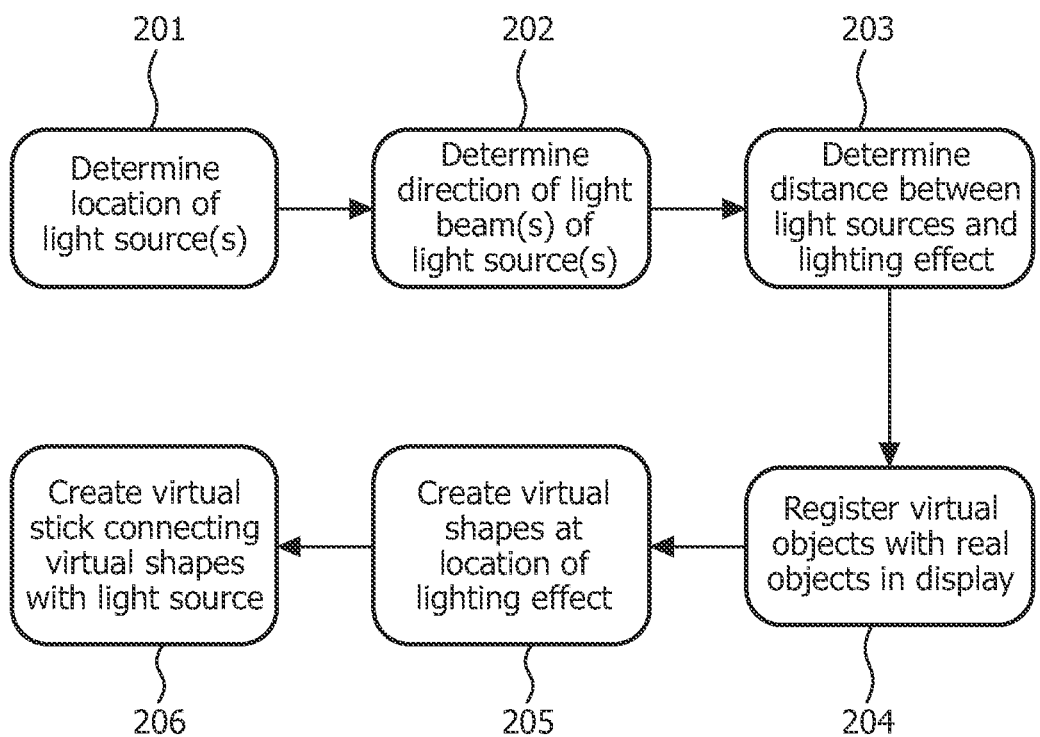
FIG. 4 illustrates an embodiment of a method of locating a lighting effect in the display of the augmented reality display device.

These locations, distances, and/or angles may be utilized in detecting and defining the location of light spots on the display device 130 or other control device utilizing lighting representations presented on a display. For example, in some embodiments a virtual reality display of the actual environment may be created utilizing, for example, a schematic representation of the actual environment and/or a 3D model of the environment. In other embodiments an augmented reality display may be created. FIG. 4 illustrates one embodiment of a method of locating a lighting effect in an augmented reality display. At steps 201-203 the location of the lighting effect in the real environment is determined. At step 201 the location of one or more light sources is determined. At step 202 the direction of the light beam(s) generated by each of the light sources is determined. At step 203 the distance between the light source(s) and the lighting effect is determined. Steps 201-203 may utilize, for example, one or more sensors and/or values discussed herein with respect to FIG. 3.

At step 204, registration occurs to align virtual objects with real objects in the augmented reality display. For example, in some embodiments markers and video processing may be utilized to register virtual objects with real objects in the augmented reality display. Markers may be placed in the real environment and their locations configured. The markers are then detected in the augmented video display utilizing video processing. Also, for example, in some embodiments a rough 3D model of the real environment may be made and, utilizing video processing, elements of the real environment (e.g., corners of a room) may be detected and mapped to the rough 3D model. Also, for example, in some embodiments geometric reasoning may be utilized. For example, detected location and aiming parameters of the display device 130 may be measured and mapped onto the coordinates of the environment. The camera and/or display properties of the display device 130 may also be taken into account.

At step 205, two virtual shapes are created in virtual space at the location of the lighting effect. The virtual shapes may include inner and outer concentric shapes. In some embodiments the inner virtual shape may be sized, shaded, colored, and/or shaped to represent a property of the light source and the outer virtual shape may be sized, shaded, colored, and/or shaped to represent a property of the lighting effect. For example, the diameter of the inner shape may be an indication for the beam width and the greyness of the inner shape may be an indication of the dimming level of the light source. Also, for example, the diameter of the outer shape may be an indication for the effect size and the greyness of the outer shape may represent the illumination of the lighting target. These virtual shapes are mapped together with the real picture in the display of the augmented reality device.

At step 206, a virtual stick is drawn that connects the virtual shapes with the light source. As described herein, the virtual stick may be made to be movable in various embodiments. For example, when moving the virtual shapes, the effect end of the stick may be configured to move with the virtual shapes and the light source end of the stick to stay in location. When moving the stick, the effect end of the stick may be configured to remain at the same location while the lamp end of the stick moves (e.g., to another light source). Although a solid line stick is illustrated in the Figures, it is understood that other fiducial markings may be utilized instead of and/or in addition to a solid line stick. For example, in some embodiments a dashed line may be provided, an irregularly shaped solid and/or dashed line, and/or a dashed or solid line made up of a plurality of symbols. Also, although the solid line stick is shown extending completely between and connecting the virtual lighting representation and the virtual light source, in some embodiments the stick (or other marking) may only extend partially between the virtual lighting representation and the virtual light source. Also, for example, in some embodiments the stick (or other marking) may only be associated with a lighting representation (indicating the direction of artificial light thereon) without the light source necessarily being represented in the virtual display.

The user need not be necessarily present in the real environment when controlling and/or configuring lighting in the real environment. The particular moment of time when the image or model of the real environment was obtained may be a moment in time that does not relate to the moment in time at which the user indicates desired lighting effects in a lighting system and optionally receives an indication of capabilities and restrictions of the lighting system. For example, an image of the real environment may be stored in a database together with the information of the lighting system and information of the environment. Or, in another example, a device may include a camera for obtaining the image of the real environment, and after obtaining the image the device may be relocated to another room and/or the user may move the device to a more comfortable position before providing the user input. The depiction of the real environment may be a schematic drawing of the environment or the depiction may be a recording of the environment, for example, a photograph taken at a particular moment in time.

In some embodiments, the real environment and/or lighting system model may be obtained via known technologies, such as for example the so-termed darkroom calibration or technologies that utilize coded light from the light sources and an image sensor to detect the footprints of the light sources and to detect the identification codes of the light sources. In other embodiments the real environment and/or lighting system model may be composed by a person, for example, a technician who installed the lighting system in the environment.

Figure 5:
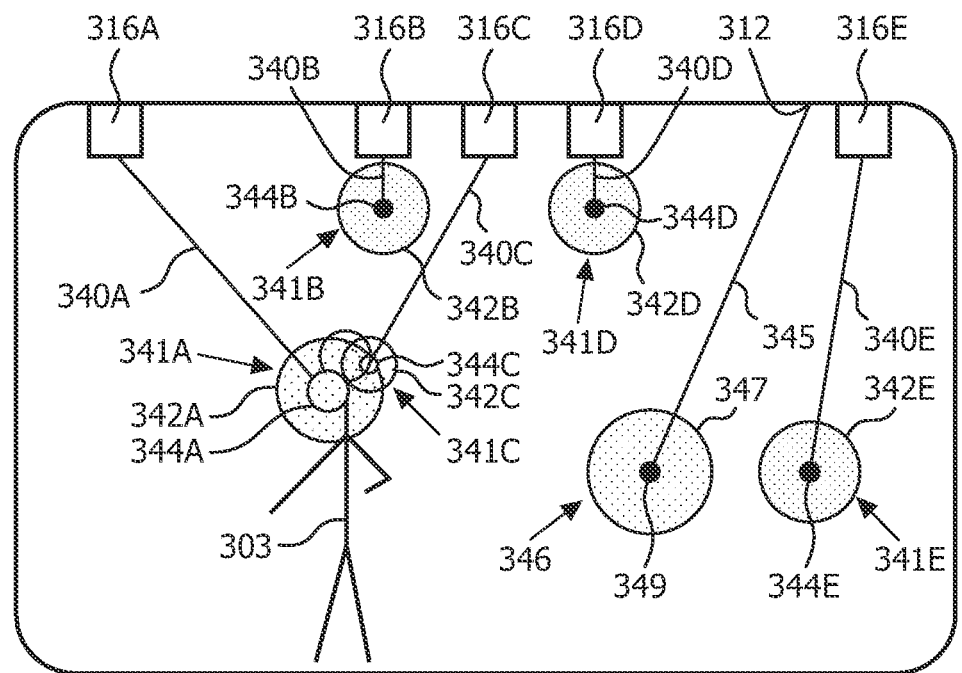
FIG. 5 illustrates the display of a reality display device with a mannequin in a first position and light sources in a first configuration.

FIG. 5 illustrates a display 331 illustrating a mannequin 303 in a first position and light sources 316A-E and 312 in a first configuration. In some embodiments the display 331 may be part of a portable device such as, for example, a mobile smart phone or a tablet computer. Optionally, the portable device may include a responsive touchscreen and be responsive to one or more touchscreen methods and/or the portable device may include an orientation sensor and be responsive to one or more movements of the portable device. The display 331 may present and augmented reality representation of a real environment in some embodiments and may present an entirely virtual representation of a real environment in some other embodiments.

The display 331 represents the mannequin 303 and five separate redirectable light sources 316A-E and 312. The redirectable light sources 316A-E may be, for example, light sources of motorized spot type lighting fixtures. The light source 312 may be, for example, an LED-based lighting fixture that includes redirectable light output via the manipulation of one or more LEDs and/or optical components thereof. In some embodiments one or more non-redirectable light sources may be provided. Optionally, such non-redirectable light sources may include at least one adjustable parameter (e.g., intensity, beam width, color). Each of the redirectable light sources 316A-E, 312 is associated with a stick 340A-E, 345 extending therefrom and a lighting representation 341A-E, 346 at an opposing end of the stick 340A-E, 345. Each lighting representation 341A-E, 346 includes an outer circle 342A-E, 347 and an inner circle 344A-E, 349.

The size of each inner circle 344A-E, 349 is indicative of the beam width of the respective light source 316A-E, 312.

The shading of each inner circle 344A-E, 349 is indicative of the dimming level of the respective light source 316A-E, 312. The size of each outer circle 342A-E, 347 is indicative of the size of the effect generated at the aiming location of the respective light source 316A-E, 312. The shading of each outer circle 344A-E, 349 is indicative of the illumination level at the aiming location of the respective light source 316A-E, 312. In FIG. 5 lighting representations 341A and 341C are illustrated overlapping atop the mannequin 303. The sticks 340A and 340C indicate that the lighting representations 341A and 341C are generated by respective of lighting fixtures 316A and 316C and that light output generating lighting representations 341A and 341C is coming from a direction generally indicated by respective of sticks 340A and 340C. The lighting representations 341B, D,E, 346 are illustrated on a wall positioned behind the mannequin 303.

Figure 6:
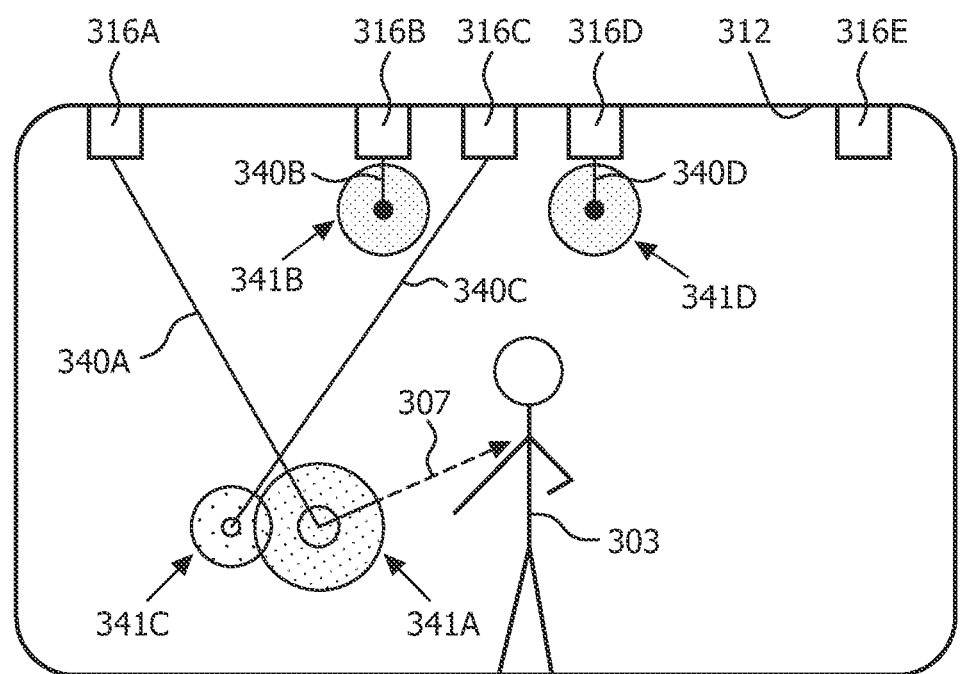
FIG. 6 illustrates the display of the augmented reality display device of FIG. 5, with the mannequin in a second position and the light sources in a second configuration.

In FIG. 6 the mannequin 303 is moved to a second position. It is to be noted that the lighting representations 341A and 341C are now directed to the wall behind the mannequin 303 since the mannequin 303 has been moved. Accordingly, the outer circles 342A and 342C are larger due to the distance between the light sources 316A and 316C and the wall being greater than the distance between the light sources 316A and 316C and the mannequin 303 in its position of FIG. 5. Also, because the same amount of light from light sources 316A and 316C is spread out over a larger area (due to the increased distance), the outer circles 342A and 342C are illustrated darker in FIG. 6 to indicate the decreased intensity of the lighting effect. As the inner circles 344A and 344C represent the properties of the light source, they remain the same because the properties of the light source (e.g., beam width or dimming level) are not changed.

In FIG. 6, the light sources 312 and 316E are also illustrated as being turned off. A user may turn the light source off by using one or more inputs. For example, in the case of a touchscreen device a user may double click the light source to turn it on or off.

Figure 7:
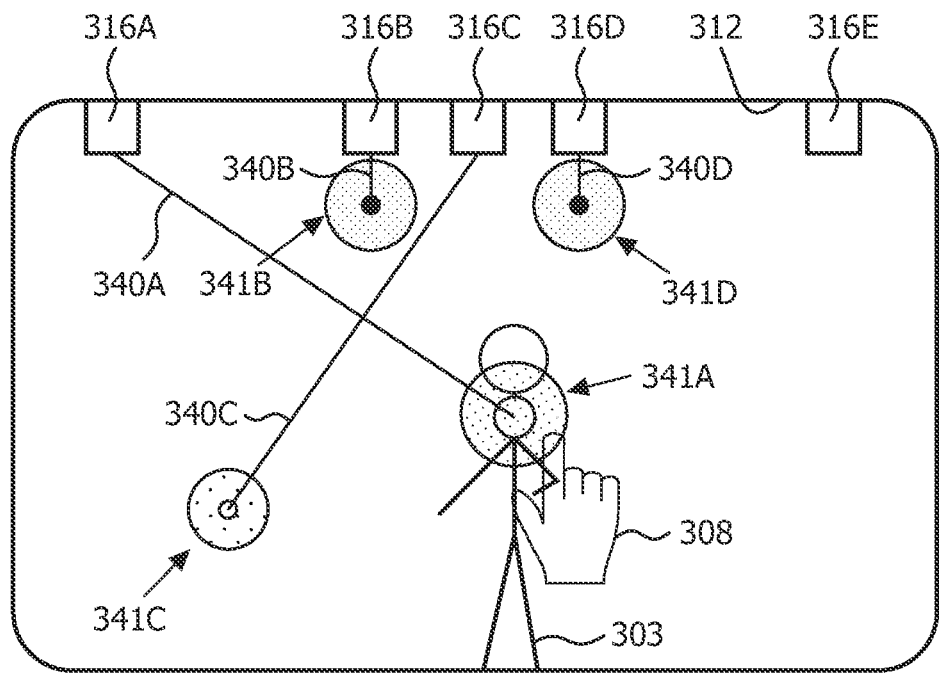
FIG. 7 illustrates the display of the augmented reality display device of FIG. 5, with the mannequin in the second position and the light in a third configuration.

In FIG. 7, the mannequin 303 is still in the second position. The lighting representation 341A is illustrated redirected to the mannequin 303 in FIG. 7. In some embodiments the lighting representation 341A may be redirected via clicking and dragging the lighting representation 341A with the pointer 308 in the direction of arrow 307 (FIG. 6) utilizing, for example, a mouse or trackball device. In other embodiments the lighting representation 341A may be redirected via one or more known touchscreen methods. For example, the lighting representation 341A may be selected and dragged with a finger. Also, for example, the lighting representation 341A may be selected with a finger and then the orientation of the display 331 adjusted by a user to adjust the lighting representation 341A. For example, tilting the display 331 will move the lighting representation 341A in a vertical direction. Feed forward may optionally be provided on the maximum adjustability of the lighting representation 341A (e.g., defined by the maximum turning angles of the spot lighting source 312A and/or obstacles in the real environment). For example, when the lighting representation 341A is selected, area(s) that are not accessible may be greyed out, indicating to the user the range of movements of the lighting representation 341A. Also, for example, when the lighting representation 341A is selected, area(s) that are accessible, may additionally or alternatively be highlighted indicating to the user the range of movements of the lighting representation 341A.

During the redirection action of the user, the pan and tilt values of the lighting source 316A are changed in the direction of the new effect position, and based on coordinates of the source and distance between light source and light effect, the location of the lighting representation is determined and mapped to the virtual screen. This results in new positions of the lighting representation 341A and gives the user the possibility to place the lighting representation 341A on the new position of the mannequin 303. The stick 340A is also adapted to the new position of the lighting representation 341A on the screen.

In some embodiments the pan and tilt values of the lighting source 316A may be derived from the movement of a user's finger on a touchscreen or from the movement of a pointer on a screen via another input device. For example, an initial movement of the lighting representation 341A to the mannequin 303 on a virtual screen by a user will cause a controller to direct the lighting source 316A to initially pan and/or tilt in a direction generally toward the mannequin 303 in the real environment. After the initial pan and/or tilt, the new position of the lighting effect in the real environment may be determined utilizing, for example, a distance sensor of the lighting source 316A and/or other inputs discussed herein. The new position of the lighting representation 341A may then be updated and positioned on the display 331. The new position may be different from the intended target (e.g., the position of the finger on the touchscreen), and, if so, the controller may direct the lighting source 316A to pan and/or tilt farther and then determine the position of the lighting effect in the real environment and update the position on the display 331. After one or more iterations of adjusting the light source 316A, determining the real world location of the lighting effect, updating the location on the display 331, and further adjusting the light source if the location is different than the intended target, the real world and virtual location of the lighting effect will match the intended target.

One potential sequence of events while adjusting the lighting representation 341A to the mannequin 303 on a virtual screen by a user involves a user tapping the lighting representation 341A then dragging his finger in the direction of arrow 307. In response, the lighting source 316A is adjusted in the direction of arrow 307, but the real world lighting effect is initially located on the wall located behind the mannequin 303. The user may continue to drag his finger further in the direction of arrow 307 and the real world lighting effect will continue on the wall behind the mannequin 303 until it is intersected by the mannequin 303. At that time the lighting representation 341A is correctly positioned and its location will be updated in the display 331 to reflect that it is atop the mannequin 303. The location and the size of the effect may be determined based on the determined distance between the lighting source 316A and the mannequin 303 and the virtual display characteristics (shading, size) of the effect aspect of the lighting representation 341A may be determined based in part on that distance.

Figure 8:
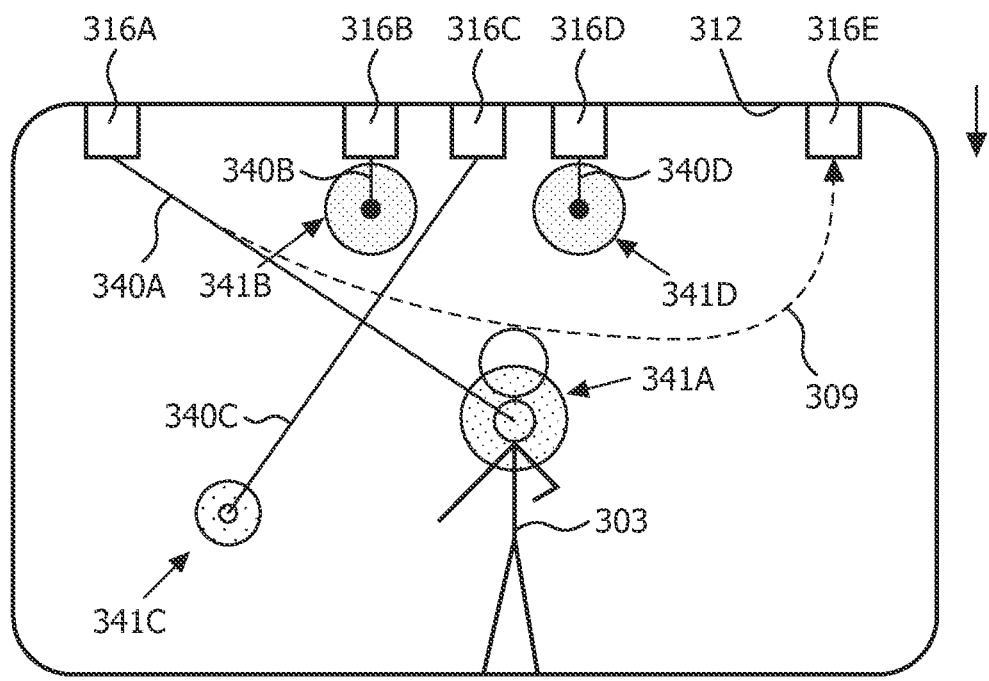
FIGS. 8 and 9 illustrate the display of the augmented reality display device of FIG. 5, with the mannequin in the second position; the lighting effect on the mannequin is illustrated being switched to be generated from another light source.
Figure 9:
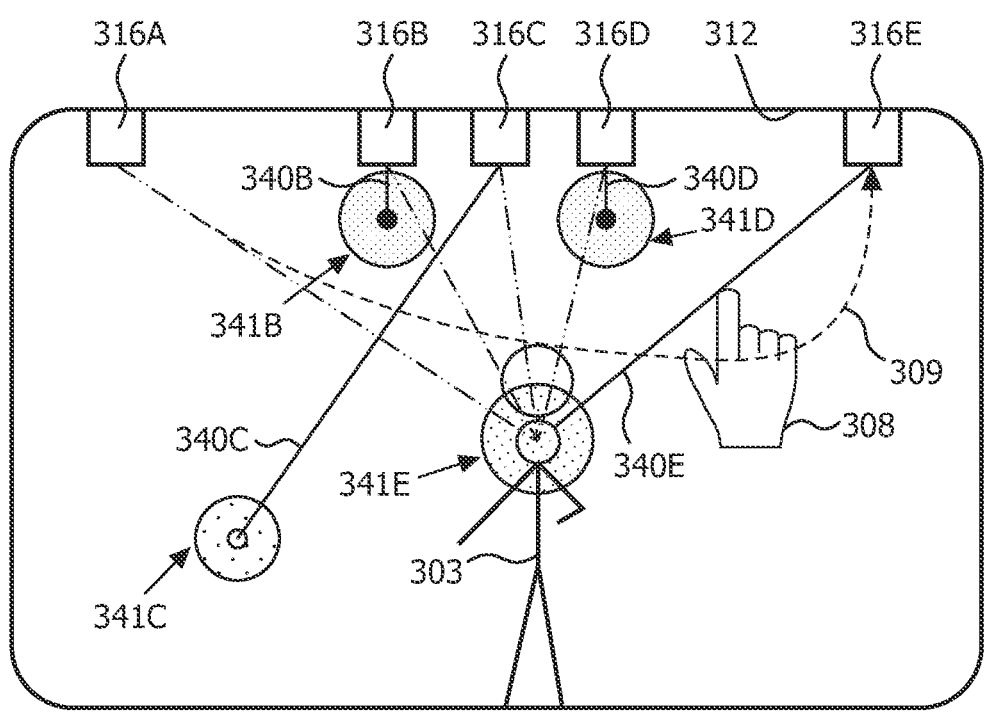

In FIGS. 8 and 9, the size of the lighting effect indicated by lighting representation 341C has been adjusted by a user to be smaller (as indicated by the smaller size of outer circle 342C). This may be accomplished via an input by a user. For example, a user may utilize a two-finger pinch gesture atop the lighting representation 341C (optionally after selection thereof) to shrink the size of the lighting effect. Also, for example, the user may double click the lighting representation 341C and be presented with a listing of adjustable parameters for the lighting effect and/or light source. The input by a user may then be communicated to the lighting system to cause the desired narrowing of the lighting effect in the real environment. For example, the positioning of a reflector around the light source 316C may be adjusted to narrow the light output. The size of the inner circle 344C may also be decreased to identify the narrower beam width of the light source 316C. The intensity of the light source 316C was not adjusted by the user between FIGS. 7 and 8. Consequently, the intensity of the lighting effect is greater in FIG. 8 as indicated by the lighter shading of outer circle 342C.

In FIG. 9, the stick 340C is shown adjusted to light source 316E thereby changing to stick 340E. The stick 340C may be moved to light source 316E by selecting the stick with pointer 308 and moving the stick in the direction of arrow 309. The stick 340C may also be moved utilizing touchscreen methods (e.g., selecting and dragging the stick 340C, selecting the stick 340C and tilting the display 331). When the stick 340C is moved to light source 316E the lighting effect on the mannequin 303 is now generated by the light source 316E and comes from the direction indicated by the stick 340E. The lighting representation 341E may be adjusted to correspond with the parameters of the new light source 316E if they are indeed different than the light source 316A (e.g., if the light source 316E is farther away or has a higher luminous output). In FIG. 9 several dashed lines are indicated. The dashed lines may indicate discrete light sources to which the stick 340C may be adjusted. In certain lighting fixtures, a stick may be adjusted to multiple discrete positions asserted with a single light source. For example, in the case of a light source whose relative position within the real environment moves (e.g., a light source placed on a crane), the stick may be moved in a continuous way. Also, for example, in the case of a lighting fixture having multiple directional LED sources, a stick may be adjusted to multiple discrete LEDs within the lighting fixture.

In the illustrated embodiment the effect end of the stick 340C remains at the same position, while the light source end is moved to a new location. If only a few possibilities for moving the light source end are valid (e.g. discrete number of light sources), the stick 340C may jump to the nearest possible light source while being moved, until it is released at the desired light source. In the case of a light on a crane, the stick may move smoothly, while the crane follows the movement of the light source end of the stick. In some alternative embodiments, when moving the stick close to a light source representation on the display 331, the light source becomes active (representation changes appearance and/or real world light source may instantly show a preview of the effect), and when the user releases the stick 340C it automatically connects to the closest light source. Optionally, areas that are non-accessible by the stick 340C (e.g., light sources that are too far away and/or are blocked by obstacles) may be greyed out indicating to the user an available range and/or areas that are accessible by the stick 340C may be highlighted.

By using known touchscreen, gesture interaction methods, and/or other inputs (e.g., a keyboard, stylus, and/or a mouse) other properties of the light effect may optionally be changed. For example, one or more of color temperature, color, beam shape, and filters or gobos that can be placed in front of the light source may be altered. For example, the beam shape may be altered by double clicking on the lighting representation and selecting from a plurality of predefined beam shape options. Optionally, when the beam shape is altered the shape of the lighting representation may be altered to correspond with such beam shape. Also, optionally, when the color or color temperature is altered, the color of the lighting representation may be altereed to correspond with such selected color.

Also, sequences that change the temporal or spatial behaviour of the light effect can be activated via user input. Light source parameters may also optionally be locked via user input to prevent changes such as, for example locking the pan, tilt, and/or dimming level of a light source. When a parameter is locked, the system may prevent on screen interactions that are counter to such parameter. For example, when moving a stick, the stick may not jump to a light source having a locked pan parameter that does not correspond with the necesarry pan parameter to create a lighting effect at the desired location.

Also, constraints may be placed on certain lighting effects. For example, a constraint to "keep intensity to approximately 1000 lux" may be placed on a lighting effect. When the lighting effect is redirected, the distance to the light source and thus the intensity may change. This change may optionally be automatically compensated by adjusting the dimming level of the light source.

When multiple lighting representations are pointed to the same location, the lighting representations (circles in the Figures) may be stacked on each other in the display. In some embodiments by tapping several times on the stacked lighting representations, the user can browse through the individual lighting representations in the stack.

In some embodiments the lighting representations may be fixable on a certain object in the real environment, such that the lighting representations will follow the object when it is moved in the real environment. For example, one or more actors may be tracked across a stage. Also, for example, a product on a shelf may be illuminated even when it is picked up now and then, and put back at a slightly different location. The interface may offer an interaction mechanism for users to indicate which objects should be illuminated, and with which lighting properties. Properties such as, for example, the lighting intensity and spot size may be fixed to a certain object.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. It should also be understood that, unless clearly indicated to the contrary, in any methods claimed herein that include more than one step or act, the order of the steps or acts of the method is not necessarily limited to the order in which the steps or acts of the method are recited.

Also, reference numerals appearing in the claims between parentheses, if any, are provided merely for convenience and should not be construed as limiting the claims in any way.

The invention claimed is:

1. An interactive system for controlling redirectable lighting in a lighting environment, comprising:
   an interactive display having a representation of said lighting environment,
   said representation including a plurality of light sources, a plurality of repositionable lighting representations, and a repositionable directional fiducial marking,
   said repositionable directional fiducial marking associated with a first lighting representation of said plurality of repositionable lighting representations and indicating a direction of light for said first lighting representation,
   wherein said first lighting representation includes a first outer shape and a first inner shape encapsulated within said first outer shape, and wherein at once one of the first outer shape or the first inner shape is sized, shaded, colored or shaped to represent a first setting of a given light source, and the other of the first outer shape or the first inner shape is sized, shaded, colored or shaped to represent a property of a first lighting effect generated by said given light source when set to said setting,
   wherein said plurality of repositionable lighting representations includes a second lighting representation that is different from said first lighting representation,
   wherein the second lighting representation comprises a second outer shape and a second inner shape encapsulated within said second outer shape, and wherein at once one of the second outer shape or the second inner shape is sized, shaded, colored or shaped to represent a second setting of a second light source, which is different from the given light source, and the other of the second outer shape or the second inner shape is sized, shaded, colored or shaped to represent a second property of a second lighting effect generated by said second light source when set to said second setting,
   wherein said second lighting effect is disposed in a location that is different from a location in which said first lighting effect is disposed, and
   wherein the other of the first outer shape or the first inner shape is displayed in said interactive display simultaneously with a display of said other of the second outer shape or the second inner shape in said interactive display.

2. The interactive system of claim 1, wherein said fiducial marking extends from adjacent one of said plurality of light sources toward said first lighting representation and is individually repositionable to other of said plurality of light sources.

3. The interactive system of claim 2, wherein said fiducial marking is a line.

4. The interactive system of claim 1, wherein said first lighting representation corresponds to a current position of said first lighting representation and to which of said plurality of light sources said fiducial marking extends toward.

5. The interactive system of claim 1, wherein to represent the first setting of the given light source comprises utilizing at least one of a variable size and a variable shading corresponding to a lighting parameter of the given light source.

6. The interactive system of claim 1, wherein to represent the property of the first lighting effect comprises utilizing at least one of a variable size and a variable shading corresponding to the first lighting effect at a current position of said first lighting representation.

7. The interactive system of claim 5, wherein said variable size corresponds to a beam width.

8. The interactive system of claim 7, wherein to represent the first setting of said given light source comprises utilizing both said variable size and said variable shading.

9. The interactive system of claim 6, wherein said variable size corresponds to a size of said first lighting effect.

10. The interactive system of claim 9, wherein to represent the property of the first lighting effect comprises utilizing both said variable size and said variable shading.

11. The interactive system of claim 10, wherein said variable shading corresponds to an illumination level of said current position.

12. The interactive system of claim 1, wherein any alteration of a size, shade, color or shaping of said shape representing the first setting of the given light source alters, in at least said interactive display, a corresponding size, shade, color or shaping of said shape representing the property of the first lighting effect.

13. The interactive system of claim 1, wherein said property of the first lighting effect is a property of the first lighting effect generated by said given light source in said direction when said given light source is set to said first setting.

14. The interactive system of claim 12, wherein said property of the first lighting effect is a property of the first lighting effect generated by said given light source in said direction when said given light source is set to said first setting.

* * * * *